US007071762B2

(12) United States Patent
Xu et al.

(10) Patent No.: US 7,071,762 B2
(45) Date of Patent: Jul. 4, 2006

(54) SUPPLY ASSEMBLY FOR A LED LIGHTING MODULE

(75) Inventors: Peng Xu, Ridgefield, CT (US); Bertrand Johan Edward Hontele, Eindhoven (NL); Jean-Pierre Kuppen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/323,445

(22) Filed: Dec. 19, 2002

(65) Prior Publication Data

US 2003/0085749 A1 May 8, 2003

Related U.S. Application Data

(63) Continuation-in-part of application No. 09/773,159, filed on Jan. 31, 2001, now Pat. No. 6,580,309.

(30) Foreign Application Priority Data

Feb. 3, 2000 (EP) .......................................... 00200370

(51) Int. Cl.
*H03K 17/56* (2006.01)

(52) U.S. Cl. ...................... 327/423; 327/514; 315/291; 315/224

(58) Field of Classification Search ................ 327/423, 327/514, 515; 363/21, 21.1; 315/224, 291
See application file for complete search history.

(56) References Cited

U.S. PATENT DOCUMENTS 6,320,330 B1 * 11/2001 Haavisto et al.
6,329,760 B1 12/2001 Bebenroth ................. 315/200

FOREIGN PATENT DOCUMENTS

| | | | |
|---|---|---|---|
| DE | 19810827 | | 9/1999 |
| DE | 19732828 | | 1/2001 |
| EP | 0948241 A2 | | 10/1999 |
| JP | 2002184588 A | * | 6/2002 |
| JP | 2002203988 A | * | 7/2002 |

* cited by examiner

*Primary Examiner*—Quan Tra
(74) *Attorney, Agent, or Firm*—Edward W. Goodman

(57) ABSTRACT

A supply assembly for an LED lighting module includes a control switch for supplying a constant current to the LED lighting module. A dual switching signal composed of low frequency bursts of high frequency pulses is applied to the control switch. By varying the low frequency component of the dual switching signal, the average current through the LED lighting module may be varied in order to vary the light intensity outputted by the LED lighting module.

23 Claims, 6 Drawing Sheets

SUPPLY ASSEMBLY FOR A LED LIGHTING MODULE

CROSS REFERENCE TO RELATED APPLICATIONS

This is a continuation-in-part of U.S. patent application Ser. No. 09/773,159, filed Jan. 31, 2001 now U.S. Pat. No. 6,580,309 which is herein incorporated by reference Pub. No. US 2001/0024112 A1.

CROSS-REFERENCE TO RELATED APPLICATIONS

This is a continuation-in-part of U.S. patent application Ser. No. 09/773,159, filed Jan. 31, 2001, now Pub. No. US 2001/0024112 A1, published Sep. 27, 2001.

BACKGROUND OF THE INVENTION

1. Field of the Invention

The subject invention relates to a supply assembly for supplying power to a light emitting diode (LED) lighting module.

2. Description of the Related Art

LED lighting modules are becoming more common in many applications for replacing less efficient incandescent lamps, for example, in traffic signal lights and automobile lighting. Depending on the amount of light required in the application, the LED lighting modules may consist of a plurality LED's arranged in parallel or in series, or a combination of both. In either case, the LED lighting module receives operating power from a supply assembly that switches a direct current voltage on and off at a high frequency. Such supply assemblies are known as switched-mode power supplies and are available in a plurality of forms, for example, a flyback converter, a buck converter, a half-bridge converter, etc. Each of these converters is capable of supplying a constant current to the LED lighting module in the form of a pulse width modulated signal.

In the use of LED lighting modules, it is desirable to be able to control the intensity of the light being output by the LED lighting module. This may be achieved in a number of ways. For example, the amount of current delivered to the LED lighting module may be adjusted by controlling the pulse width modulation. However, once the current intensity drops below 20% of the nominal current intensity, the relation between the current intensity and the light output becomes largely non-linear, and the efficiency of the LED lighting module becomes far from optimal.

U.S. Pat. No. 5,661,645 describes a power supply for a light emitting diode array which includes a circuit for interrupting the supply of power from the power supply to the LED array. As shown in FIG. 1 herein, the power supply 1 includes a supply of direct current voltage 10, which may be a battery or rectified line alternating current (AC) voltage connected to a switched-mode converter 12 typically having a control switch 14, a diode 16, an inductor 18, an optional capacitor 20 and an optional transformer 22. A control input of the control switch 14 receives a high frequency pulse-width modulated (PWM) switching signal. Outputs from the power supply 1 are connected to an LED lighting module 2 having an LED array 24 (shown herein as a single LED) and a controllable switch 26 for interrupting the supply of power to the LED array 24. The controllable switch 26 receives a low frequency PWM switching signal for controlling the mean current to the LED array 24. FIG. 2 shows a plot of the current through the LED array 24 in which the low frequency PWM switching signal causes current pulses D occurring in the period $F_D$, and the high frequency PWM switching signal causes the current variation $\Delta I_D$. While this arrangement ensures that the LED array always operates in an efficient manner, it should be understood that the power supply 1 is continually on even when the PWM switching signal has the controllable switch 26 turned off. FIG. 3 shows an equivalent circuit of the arrangement of FIG. 1. As should be apparent, while the power from the DC source is stopped when the control switch 14 is open, such is not the case when the controllable switch 26 is open. As such, this arrangement suffers from an unnecessary loss of energy.

Published U.S. Patent Application No. 2001/0023112A1 discloses an alternate arrangement to that shown in U.S. Pat. No. 5,661,645. In this alternate arrangement, the power supply itself is turned on and off using the low frequency PWM switching signal. FIG. 4 shows an example of this alternate arrangement. Similarly as in FIG. 1, the power supply 1' includes a supply of direct current voltage 10, which may be a battery or rectified line alternating current (AC) voltage connected to a switched-mode converter 12' typically having a control switch 14, a diode 16, an inductor 18, an optional capacitor 20 and an optional transformer 22. A control input of the control switch 14 receives a high frequency pulse-width modulated (PWM) switching signal. Outputs from the power supply 1' are connected to an LED lighting module 2' having an LED array 24 (shown herein as a single LED). The LED lighting module 2' does not include the controllable switch 26 shown in FIG. 1. Rather, the switched-mode converter 12' includes an input for receiving the low frequency PWM switching signal which effectively controls means for turning on and off the switched-mode converter 12'.

SUMMARY OF THE INVENTION

It is an object of the subject invention to eliminate the means for switching on and off the power supply to an LED array while still effecting the low frequency pulse width modulation of the current to the LED array.

This object is achieved in a supply assembly for a LED lighting module comprising a direct current (DC) voltage source having a first and a second supply terminal; a series arrangement of a diode and a controllable switch connected across the first and second supply terminals of the DC voltage source; an inductor connecting the first supply terminal of the DC voltage source to an first output terminal, a node between the diode and the controllable switch forming a second output terminal, said LED lighting module being connectable between the first and second output terminals; and a controller for controlling the switching of the controllable switch, said controller having means for supplying a dual pulse-width modulated switching signal to said controllable switch at two frequencies including a high frequency pulse-width modulated switching signal component for controlling a magnitude of the LED current, and a low frequency pulse-width modulated switching signal component for controlling a duration of the LED current.

Applicants have found that the control switch in the switched-mode power supply may be used for both the high frequency PWM switching as well as the low frequency PWM switching thereby eliminating the need for separate means for switching the power supply on and off. To that end, the supply signal to the control switch includes both the high frequency PWM switching signal as well as the low frequency PWM switching signal, i.e., the high frequency switching signal is applied in pulse bursts at the low frequency to the control switch.

Applicants have further found that when the power supply is switched on and off by separate means, there is a gradual increase and decrease in the duty cycle, while when a dual PWM switching signal is applied to the control switch, the change in the duty cycle is instantaneous.

In a further embodiment of the subject invention, the controller further comprises an input for receiving a current signal indicative of the LED current, and means for modifying said low frequency pulse-width modulated switching signal component in dependence on said current signal.

Applicants have found that by detecting the LED current, the duty cycle of the high frequency PWM switching signal component may quickly respond to the LED current leading to the fastest rise/fall time of the LED current.

BRIEF DESCRIPTION OF THE DRAWINGS

With the above and additional object and advantages in mind as will hereinafter appear, the subject invention will be described with reference to the accompanying drawings, in which:

FIG. 12C shows the details of the LED current at turn on.

DESCRIPTION OF THE PREFERRED EMBODIMENTS

Figure 1:
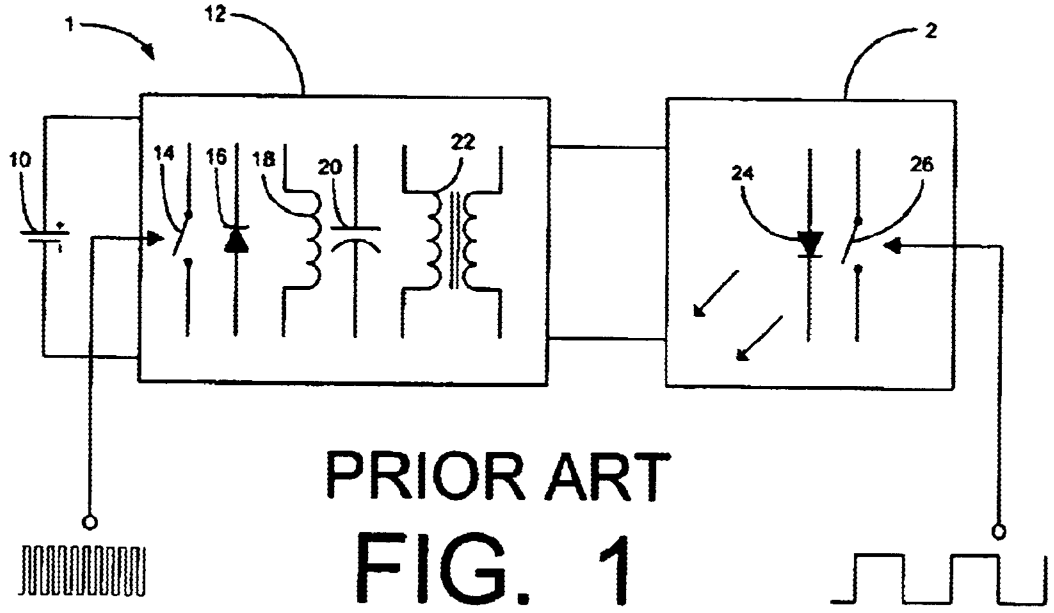
PRIOR ART FIG. 1
FIG. 1 shows a generic block circuit diagram of a prior art power supply for an LED array.
Figure 2:
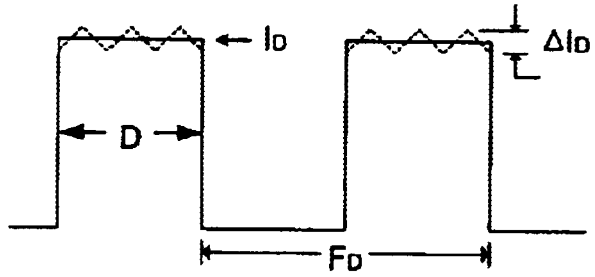
PRIOR ART FIG. 2
FIG. 2 shows a graph of the current through the LED array of FIG. 1.
Figure 4:
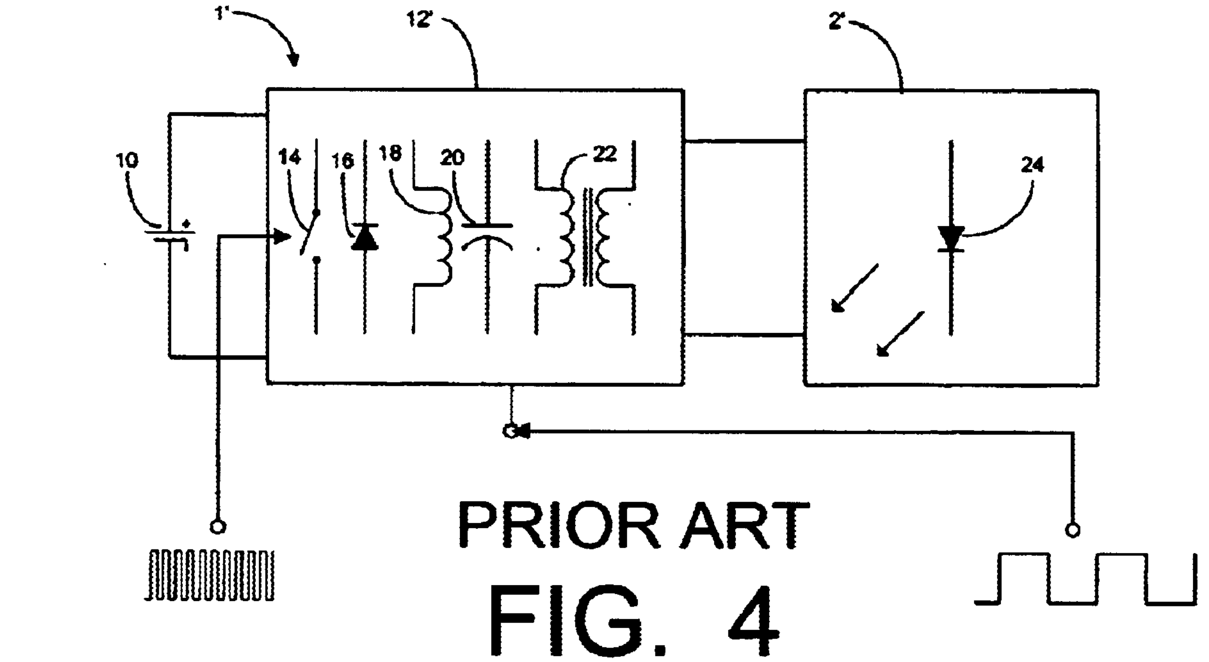
PRIOR ART FIG. 4
FIG. 4 shows a generic block circuit diagram of another prior art power supply for an LED array.
Figure 5:
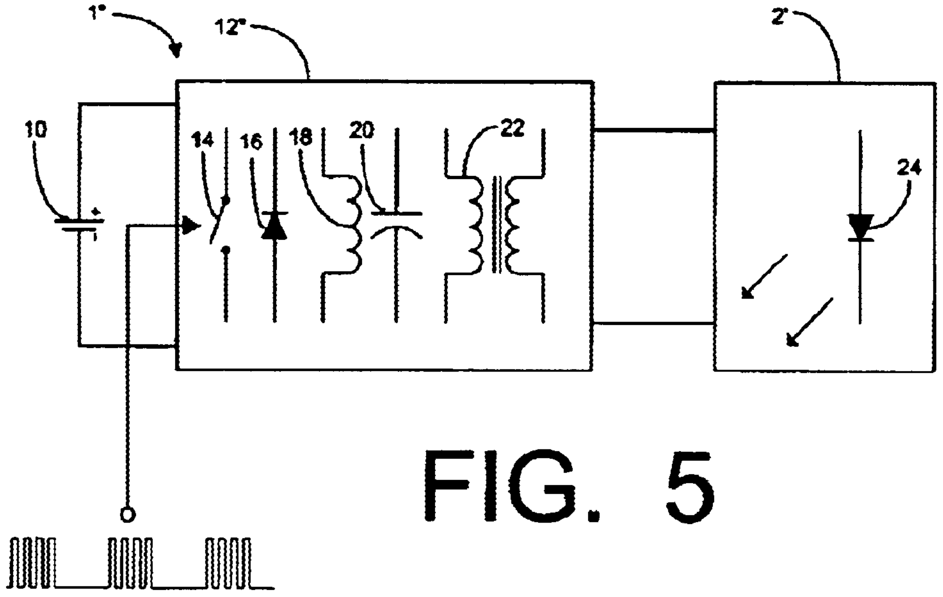
FIG. 5 shows a generic block circuit diagram of a power supply for an LED array incorporating the subject invention.
Figure 6:
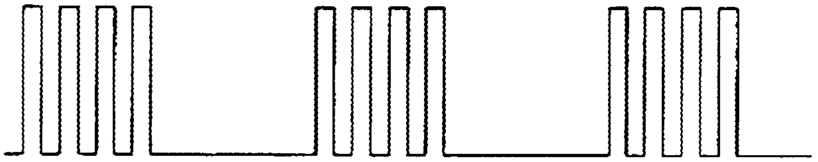
FIG. 6 shows a graph of the dual PWM control signal for the power supply of FIG. 5.

FIG. 5 shows a generic block circuit diagram of the power supply and LED lighting module of the subject invention. In particular, similarly as in FIGS. 1 and 4, the power supply 1" includes a supply of direct current voltage 10, which may be a battery or rectified line alternating current (AC) voltage connected to a switched-mode converter 12" typically having a control switch 14, a diode 16, an inductor 18, an optional capacitor 20 and an optional transformer 22. Outputs from the power supply 1" are connected to an LED lighting module 2' having an LED array 24. A control input of the control switch 14 now receives a dual PWM switching signal. As is more clearly shown in FIG. 6, this dual PWM switching signal is, in essence, a combination of a high frequency PWM switching signal component which is applied in pulse bursts at a low frequency, i.e., the low frequency PWM switching component.

Figure 7:
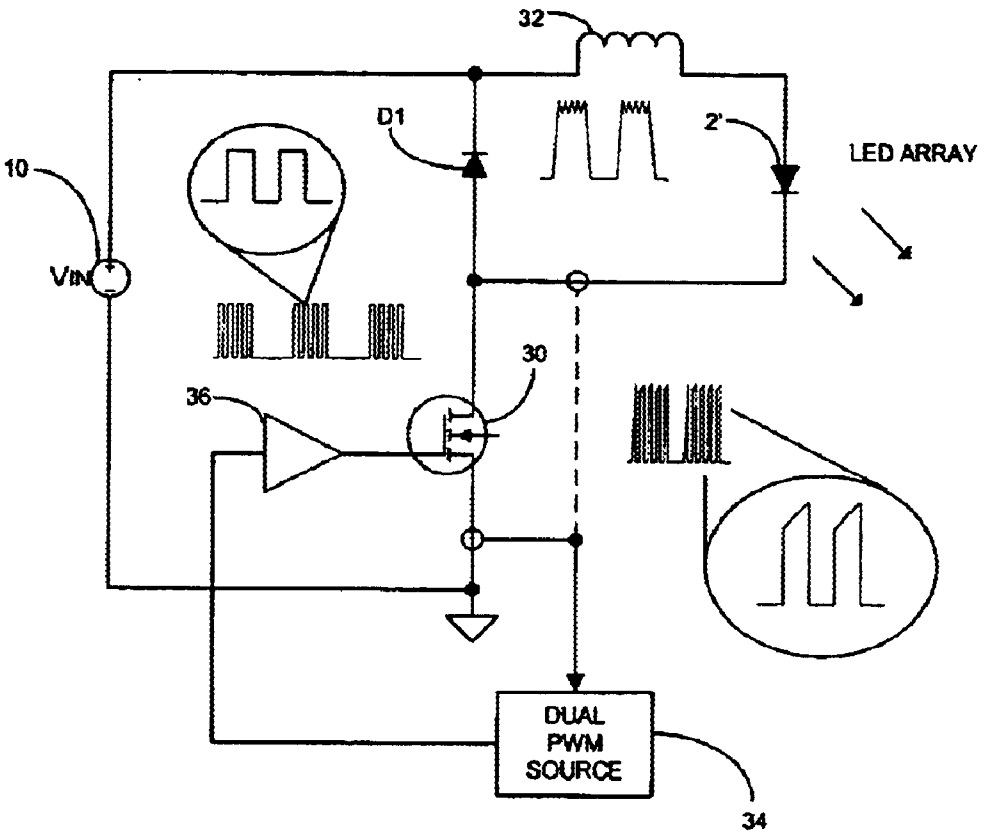
FIG. 7 shows a block circuit diagram of a buck converter for an LED array incorporating the subject invention.

FIG. 7 shows a block circuit diagram of a buck converter for an LED array incorporating the subject invention. In particular, a DC supply 10 is connected across the series arrangement of a diode D1 and a control switch 30, shown as a MOSFET, while a series arrangement of an inductor 32 and the LED lighting module 2' is connected across the diode D1. A controller 34 generates the dual PWM switching signal which is applied, via an amplifier 36 to a control input of the control switch 30. The controller 34 has an input for receiving a signal indicative of the current sensed in the drain terminal of the control switch 30, which is related to the LED current. Alternatively, as shown in dotted line, this input may receive a signal indicative of the sensed LED current.

Figure 3:
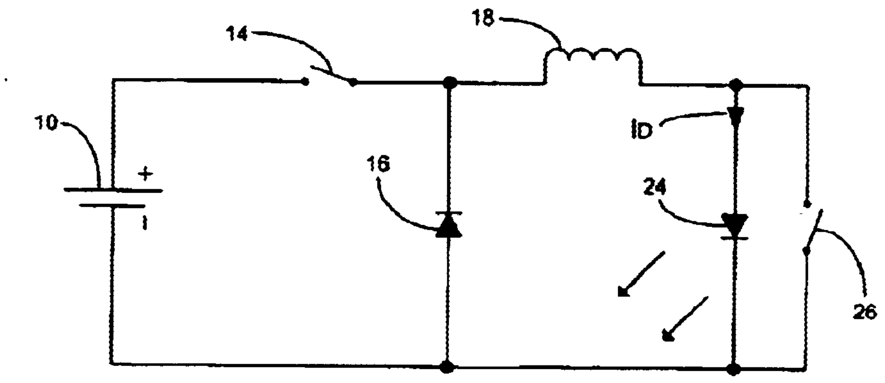
PRIOR ART FIG. 3
FIG. 3 shows an equivalent circuit of the power supply of FIG. 1.
Figure 8:
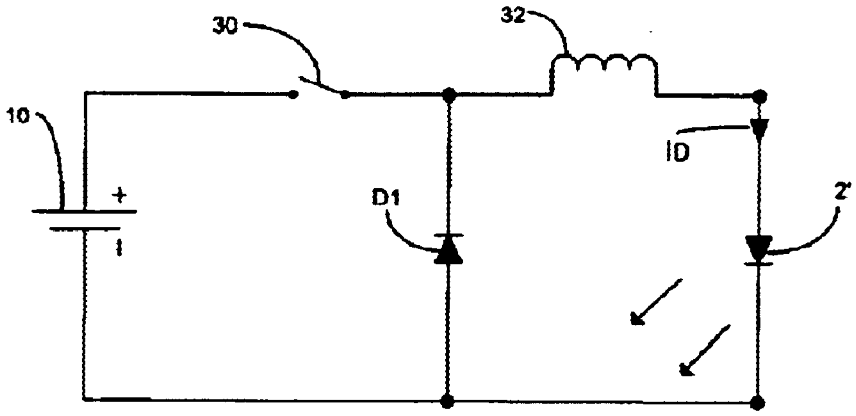
FIG. 8 shows an equivalent circuit of the power supply of FIG. 7.

FIG. 8 shows an equivalent circuit diagram of the power supply/LED lighting module of FIG. 7. It should be apparent that in this configuration, the inductor current always ramps down to zero when the control switch is turned off, thereby avoiding the current circulation problems of the circuit diagram of FIG. 3 when the controllable switch is turned off.

Figure 9:
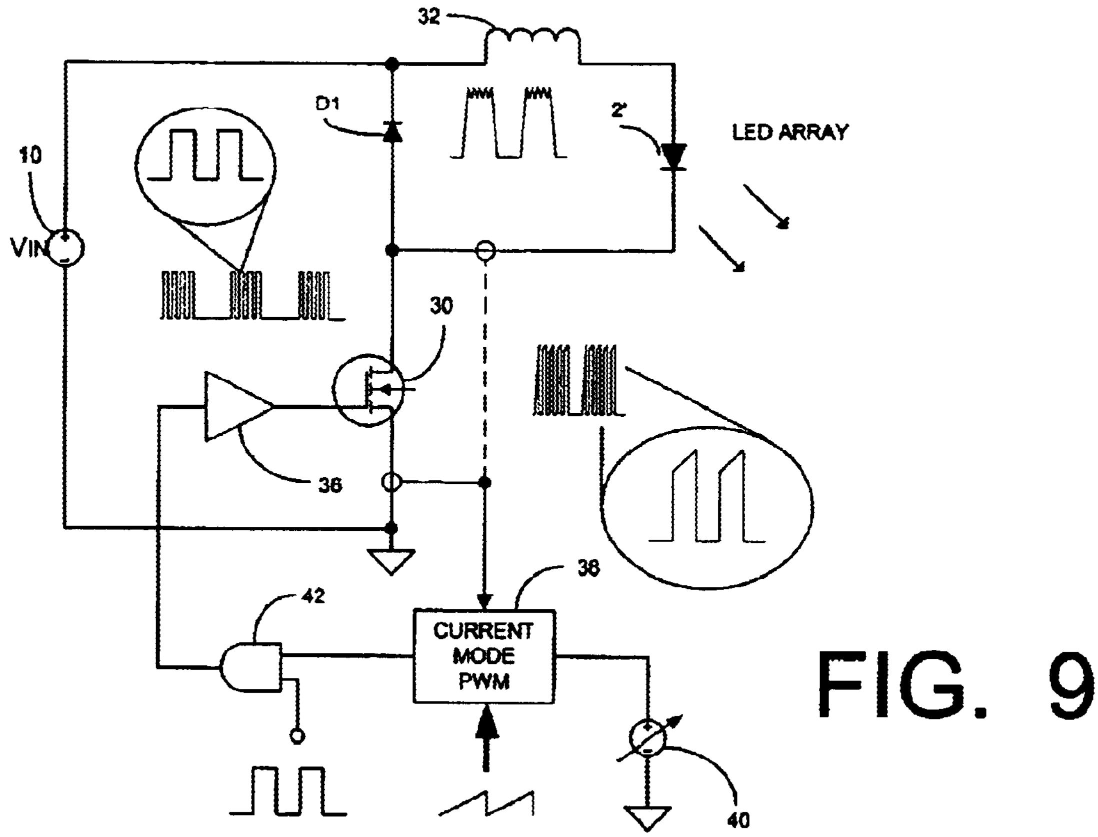
FIG. 9 shows a block circuit diagram of the power supply of FIG. 7, showing a first embodiment of the controller.

FIG. 9 shows the block circuit diagram of FIG. 7 with a first embodiment of the controller 34. In particular, the controller 34 includes a current mode pulse width modulator 38 which receives an LED current reference signal from a current source 40, the sensed current, and a high frequency sawtooth signal. The current mode pulse width modulator 38 then supplies the high frequency pulse width modulated switching signal component which is applied to one input of an AND-gate 42, the other input of which receives the low frequency PWM switching signal component. The output from the AND-gate 42 is then applied through the amplifier 36 to the gate of the control switch 30.

Figure 10:
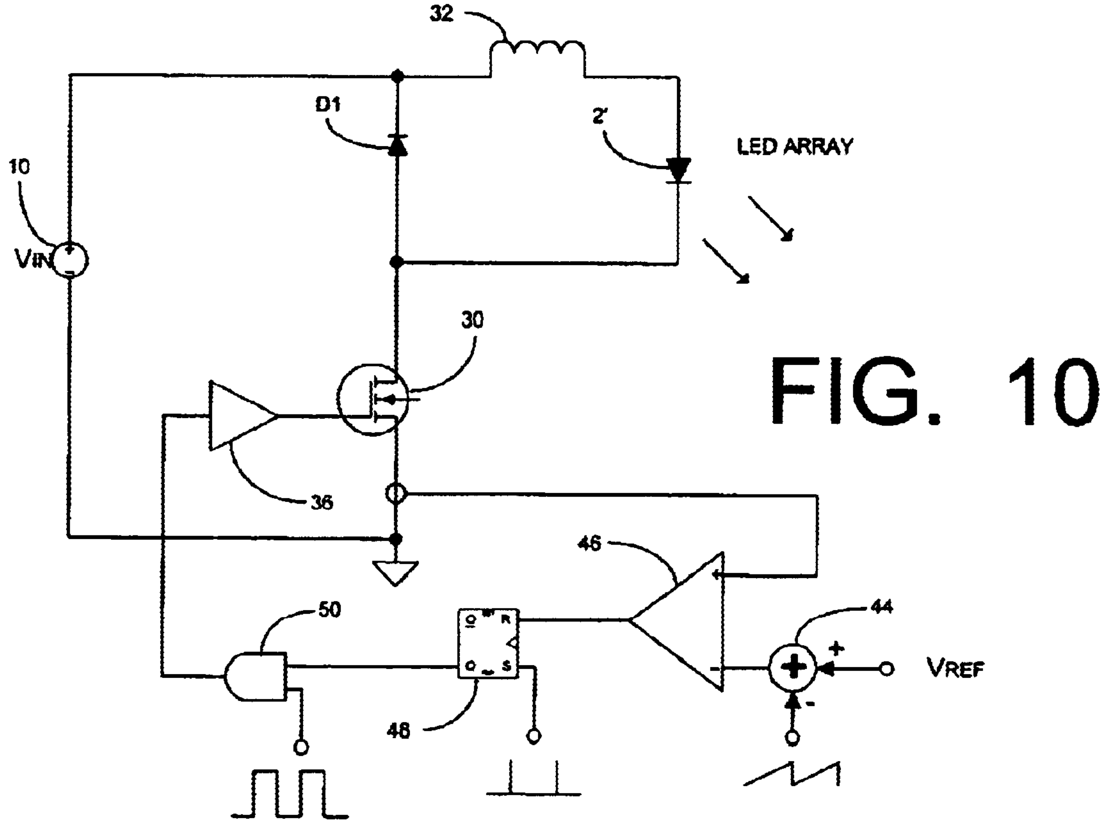
FIG. 10 shows a block circuit diagram of the power supply of FIG. 7, showing a second embodiment of the controller.

FIG. 10 shows the block circuit diagram of FIG. 7, with a second embodiment of the controller 34. In particular, the controller 34 includes an adder 44 having a positive input for receiving a reference voltage VREF and a negative input for receiving a high frequency ramp signal. An output from the adder 44 is applied to an inverting input of a comparator 46 which receives the sensed current at its non-inverting input. An output of the comparator 46 is applied to the reset input of an RS flip-flop 48 which receives a high frequency clock signal at its set input. The Q output from the RS flip-flop 48 is applied to one input of an AND-gate 50 which receives the low frequency PWM switching signal component at its other input. The output from the AND-gate 50 is then applied through the amplifier 36 to the gate of the control switch 30.

In the embodiment of FIG. 9, either peak or average current detection may be used, while in the embodiment of FIG. 10, peak current detection is used.

Figure 11:
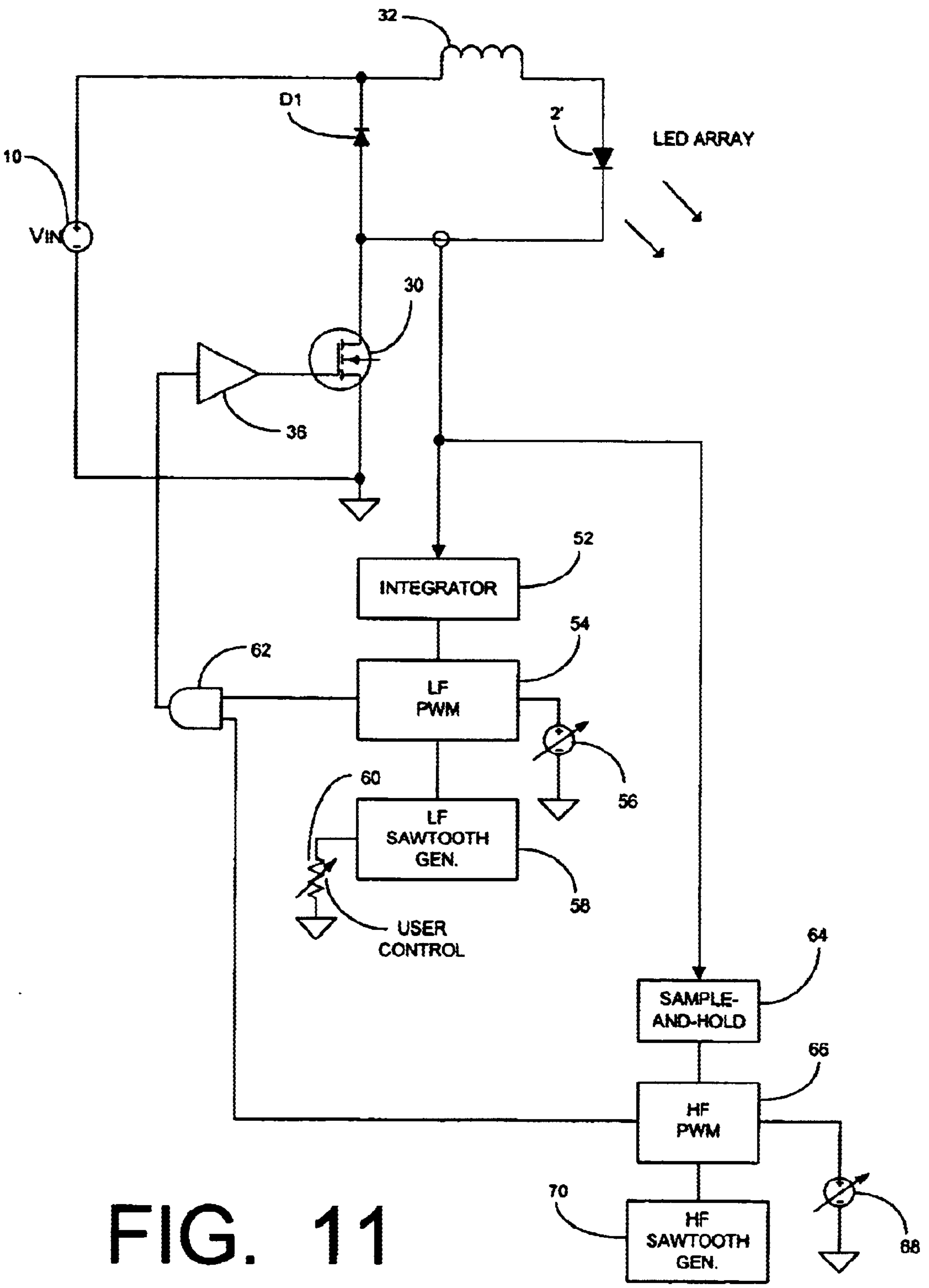
FIG. 11 shows a block circuit diagram of the power supply of FIG. 7, showing a third embodiment of the controller.

FIG. 11 shows the block circuit diagram of FIG. 7, showing a third embodiment of the controller 34 in which both peak current detection and average current detection are used. In particular, the sensed current is applied to an integrator 52 which forms an average of the sensed current. An output of the integrator 52 is applied to a low frequency pulse width modulator 54 which receives a reference current from current source 56 and a low frequency sawtooth signal from low frequency sawtooth generator 58 which has a user control 60 coupled thereto. An output from the low frequency pulse width modulator 54 is applied to a first input of an AND-gate 62. The sensed current is also applied to a sample-and-hold circuit 64. An output from the sample-and-hold circuit 64, which represents the peak sensed current, is applied to a high frequency pulse width modulator 66 which also receives a reference current from current source 68 and a high frequency sawtooth signal from high frequency sawtooth generator 70. The output from the high frequency pulse width modulator 66 is applied to the second input of the AND-gate 62, and the output from the AND-gate 62 is then applied through the amplifier 36 to the gate of the control switch 30.

In operation, the user sets a desired intensity level for the LED lighting module using the user control 60. The resulting sawtooth signal (varying in, for example, the duration of each sawtooth) generated by the low frequency sawtooth generator 58 is applied to the low frequency pulse width modulator 54. In dependence on this sawtooth signal, the reference current, and the average LED current, the low frequency pulse width modulator generates the low frequency PWM switching signal component with the appropriate pulse width. At the same time, the sensed current is applied and stored in the sample-and-hold circuit 64. The output from the sample-and-hold circuit 64, along with the reference current and the high frequency sawtooth signal are processed by the high frequency pulse width modulator 66 to adjust the pulse width of the high frequency PWM switching signal component. The AND-gate 62 then combines the high frequency and low frequency PWM switching components to form the dual PWM switching signal which is applied, via the amplifier 36 to the gate of the control switch 30.

Figure 12A:
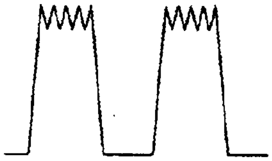
FIG. 12A shows a graph of the LED current.
Figure 12B:
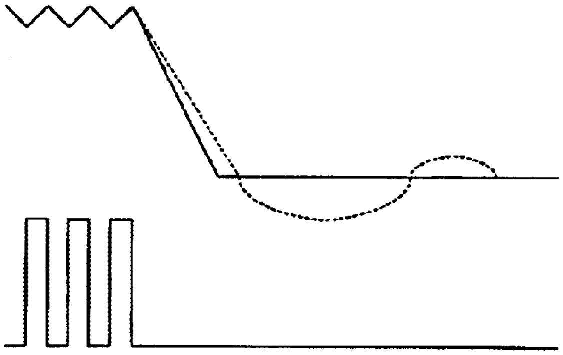
FIG. 12B shows the details of the LED current at turn off.
Figure 12C:
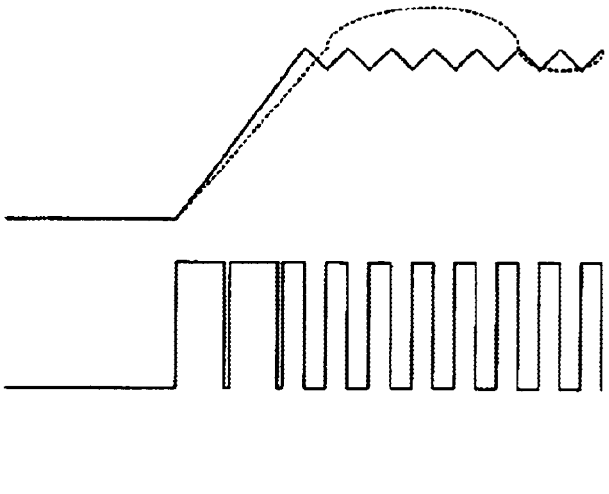

FIG. 12A shows the overall LED current. FIG. 12B shows the LED current at the end of, for example, the first pulse in FIG. 12A, as compared with the dual switching signal of FIG. 6. For comparison, FIG. 12B also shows the LED current (dotted line) if, instead, the power supply were merely turned off, which then exhibits ringing. Finally, FIG. 12C shows the LED current at the beginning of, for example, the second pulse in FIG. 12A, as compared with the dual switching signal of FIG. 6. For comparison, FIG. 12C also shows the LED current (dotted line) if, instead, the power supply were merely turned on.

Numerous alterations and modifications of the structure herein disclosed will suggest themselves to those skilled in the art. However, it is to be understood that the above described embodiments are for purposes of illustration only and not to be construed as a limitation of the invention. All such modifications which do not depart from the spirit of the invention are intended to be included within the scope of the appended claims.

What is claimed is:

1. A supply assembly for a LED lighting module comprising:

a direct current (DC) voltage source having a first and a second supply terminal;

a series arrangement of a diode and a controllable switch connected across the first and second supply terminals of the DC voltage source;

an inductor connecting the first supply terminal of the DC voltage source to a first output terminal, a node between the diode and the controllable switch forming a second output terminal, said LED lighting module being connectable between the first and second output terminals; and a controller for controlling the switching of the controllable switch, said controller having means for supplying a dual pulse-width modulated switching signal to said controllable switch at two frequencies including a high frequency pulse-width modulated switching signal component for controlling a magnitude of an LED current in said LED lighting module, and a low frequency pulse-width modulated switching signal component for controlling a duration of the LED current.

2. The supply assembly as claimed in claim 1, wherein the controller further comprises an input for receiving a sensed current indicative of the LED current, and means for modifying said low frequency pulse-width modulated switching signal component in dependence on said sensed current.

3. The supply assembly as claimed in claim 2, wherein the controller comprises:

a current source for supplying a reference current;

a source for supplying a high frequency sawtooth signal;

a current mode pulse width modulator coupled to receive said sensed current, said reference current and said high frequency sawtooth signal, said current mode pulse width modulator supplying said high frequency PWM switching signal component;

a source for said low frequency PWM switching signal component; and an AND-gate having a first input for receiving said high frequency PWM switching signal component, and a second input for receiving said low frequency PWM switching signal component, said AND-gate supplying said dual PWM switching signal.

4. The supply assembly as claimed in claim 2, wherein the controller comprises:

an adder for receiving a voltage reference signal and a high frequency sawtooth signal;

a comparator having an inverting input coupled to an output of said adder, and a non-inverting input coupled to receive said sensed current;

an RS flip-flop having a reset input coupled to an output of said comparator and a set input coupled to receive a high frequency clock signal; and an AND-gate having a first input coupled to an output of said RS flip-flop, and a second input coupled to receive the low frequency PWM switching signal component, said AND-gate supplying said dual PWM switching signal.

5. The supply assembly as claimed in claim 2, wherein the controller comprises:

an integrator coupled to receive said sensed current, said integrator forming an average of said sensed current;

a low frequency sawtooth generator having a variable user control input for varying a generated low frequency sawtooth signal;

a first reference current source;

a low frequency pulse width modulator coupled to receive said average sensed current, said low frequency sawtooth signal and said first reference current, said low frequency pulse width modulator varying a pulse width of the generated low frequency PWM switching signal component in dependence on the average sensed current and the low frequency sawtooth signal;

a sample-and-hold circuit also coupled to receive said sensed current, said sample-and-hold circuit having a control input for receiving the low frequency PWM switching signal component as a gate signal, said sample-and-hold circuit supplying a peak current signal of said sensed current;

a second reference current source;

a high frequency sawtooth generator for generating a high frequency sawtooth signal;

a high frequency pulse width modulator coupled to receive said peak current signal, said second reference current and said high frequency sawtooth signal, said high frequency pulse width modulator varying a pulse width of the generated high frequency PWM switching signal component in dependence on the peak current signal and the high frequency sawtooth signal; and an AND-gate having a first input for receiving the low frequency PWM switching signal component, and a second input for receiving the high frequency PWM switching signal component, said AND-gate supplying said dual PWM switching signal.

6. The supply assembly as claimed in claim 1, wherein the controller comprises:

a current source for supplying a reference current;

a source for supplying a high frequency sawtooth signal;

a current mode pulse width modulator coupled to receive said sensed current, said reference current and said high frequency sawtooth signal, said current mode pulse width modulator supplying said high frequency PWM switching signal component;

a source for said low frequency PWM switching signal component; and an AND-gate having a first input for receiving said high frequency PWM switching signal component, and a second input for receiving said low frequency PWM switching signal component, said AND-gate supplying said dual PWM switching signal.

7. The supply assembly as claimed in claim 6, wherein a change in duty cycle of said controllable switch is substantially instantaneous when said dual pulse-width modulated switching signal is applied to said controllable switch.

8. The supply assembly as claimed in claim 1, wherein the controller comprises:

an adder for receiving a voltage reference signal and a high frequency sawtooth signal;

a comparator having an inverting input coupled to an output of said adder, and a non-inverting input coupled to receive said sensed current;

an RS flip-flop having a reset input coupled to an output of said comparator and a set input coupled to receive a high frequency clock signal; and an AND-gate having a first input coupled to an output of said RS flip-flop, and a second input coupled to receive the low frequency PWM switching signal component, said AND-gate supplying said dual PWM switching signal.

9. The supply assembly as claimed in claim 8, wherein a change in duty cycle of said controllable switch is substantially instantaneous when said dual pulse-width modulated switching signal is applied to said controllable switch.

10. The supply assembly as claimed in claim 1, wherein the controller comprises:

an integrator coupled to receive said sensed current, said integrator forming an average of said sensed current;

a low frequency sawtooth generator having a variable user control input for varying a generated low frequency sawtooth signal;

a first reference current source;

a low frequency pulse width modulator coupled to receive said average sensed current, said low frequency sawtooth signal and said first reference currant, said low frequency pulse width modulator varying a pulse width of the generated low frequency PWM switching signal component in dependence on the average sensed current and the low frequency sawtooth signal;

a sample-and-hold circuit also coupled to receive said sensed current, said sample-and-hold circuit having a control input for receiving the low frequency PWM switching signal component as a gate signal, said sample-and-hold circuit supplying a peak current signal of said sensed current;

a second reference current source;

a high frequency sawtooth generator for generating a high frequency sawtooth signal;

a high frequency pulse width modulator coupled to receive said peak current signal, said second reference current and said high frequency sawtooth signal, said high frequency pulse width modulator varying a pulse width of the generated high frequency PWM switching signal component in dependence on the peak current signal and the high frequency sawtooth signal; and an AND-gate having a first input for receiving the low frequency PWM switching signal component, and a second input for receiving the high frequency PWM switching signal component, said AND-gate supplying said dual PWM switching signal.

11. The supply assembly as claimed in claim 10, wherein a change in duty cycle of said controllable switch is substantially instantaneous when said dual pulse-width modulated switching signal is applied to said controllable switch.

12. A supply assembly for a LED lighting module comprising:

a direct current (DC) voltage source having a first and a second supply terminal;

a switched-mode converter connected to said first and second supply terminals for supplying power to an LED lighting module connectable to said converter, said converter comprising a controllable switch coupled to at least one of said first and second supply terminals for switchably connecting said DC voltage source; and a controller for controlling the switching of the controllable switch, said controller having means for supplying a dual pulse-width modulated switching signal to said controllable switch at two frequencies including a high frequency pulse-width modulated switching signal component for controlling a magnitude of an LED current in said LED lighting module, and a low frequency pulse-width modulated switching signal component for controlling a duration of the LED current;

wherein the controller comprises:

a current source for supplying a reference current; a source for supplying a high frequency sawtooth signal;

a current mode pulse width modulator coupled to receive said sensed current, said reference current and said high frequency sawtooth signal, said current mode pulse width modulator supplying said high frequency PWM switching signal component;

a source for said low frequency PWM switching signal component; and an AND-gate having a first input for receiving said high frequency PWM switching signal component, and a second input for receiving said low frequency PWM switching signal component, said AND-gate supplying said dual PWM switching signal.

13. A supply assembly for a LED lighting module comprising:

a direct current (DC) voltage source having a first and a second supply terminal;

a switched-mode converter connected to said first and second supply terminals for supplying power to an LED lighting module connectable to said converter, said converter comprising a controllable switch coupled to at least one off said first and second supply terminals for switchably connecting said DC voltage source; and a controller for controlling the switching of the controllable switch, said controller having means for supplying a dual pulse-width modulated switching signal to said controllable switch at two frequencies including a high frequency pulse-width modulated switching signal component for controlling a magnitude of an LED current in said LED lighting module, and a low frequency pulse-width modulated switching signal component for controlling a duration of the LED current;

wherein the controller comprises:

an adder for receiving a voltage reference signal and a high frequency sawtooth signal;

a comparator having an inverting input coupled to an output of said adder, and a non-inverting input coupled to receive said sensed current;

an RS flip-flop having a reset input coupled to an output of said comparator and a set input coupled to receive a high frequency clock signal; and an AND-gate having a first input coupled to an output of said RS flip-flop, and a second input coupled to receive the low frequency PWM switching signal component, said AND-gate supplying said dual PWM switching signal.

14. A supply assembly for a LED lighting module comprising:

a direct current (DC) voltage source having a first and a second supply terminal;

a switched-mode converter connected to said first and second supply terminals for supplying power to an LED lighting module connectable to said converter, said converter comprising a controllable switch coupled to at least one of said first and second supply terminals for switchably connecting said DC voltage source;

a controller for controlling the switching of the controllable switch, said controller having means for supplying a dual pulse-width modulated switching signal to said controllable switch at two frequencies including a high frequency pulse-width modulated switching signal component for controlling a magnitude of an LED current in said LED lighting module, and a low frequency pulse-width modulated switching signal component for controlling a duration of the LED current;

wherein the controller comprises;

an integrator coupled to receive said sensed current, said integrator forming an average of said sensed current;

a low frequency sawtooth generator having a variable user control input for varying a generated low frequency sawtooth signal;

a first reference current source;

a low frequency pulse width modulator coupled to receive said average sensed current, said low frequency sawtooth signal and said first reference current, said low frequency pulse width modulator varying a pulse width of the generated low frequency PWM switching signal component in dependence on the average sensed current and the low frequency sawtooth signal;

a sample-and-hold circuit also coupled to receive said sensed current, said sample-and-hold circuit having a control input for receiving the low frequency PWM switching signal component as a gate signal, said sample-and-hold circuit supplying a peak current signal of said sensed current;

a second reference current source;

a high frequency sawtooth generator for generating a high frequency sawtooth signal;

a high frequency pulse width modulator coupled to receive said peak current signal, said second reference current and said high frequency sawtooth signal, said high frequency pulse width modulator varying a pulse width of the generated high frequency PWM switching signal component in dependence on the peak current signal and the high frequency sawtooth signal; and an AND-gate having a first input for receiving the low frequency PWM switching signal component, and a second input for receiving the high frequency PWM switching signal component, said AND-gate supplying said dual PWM switching signal.

15. A method for providing a supply assembly for a LED lighting module, said method comprising the steps of:

providing a direct current (DC) voltage source having a first and a second supply terminal;

connecting a series arrangement of a diode and a controllable switch across the first and second supply terminals of the DC voltage source;

connecting an inductor between the first supply terminal of the DC voltage source and a first output terminal;

providing a node between the diode and the controllable switch forming a second output terminal;

connecting said LED lighting module being between the first and second output terminals; and providing a controller for controlling the switching of the controllable switch, said controller having means for supplying a dual pulse-width modulated switching signal to said controllable switch at two frequencies including a high frequency pulse-width modulated switching signal component for controlling a magnitude of an LED current in said LED lighting module, and a low frequency pulse-width modulated switching signal component for controlling a duration of the LED current.

16. The method as claimed in claim 15 further comprising the steps of:

providing an input to the controller for receiving a sensed current indicative of the LED current; and modifying said low frequency pulse-width modulated switching signal component in dependence on said sensed current.

17. The method as claimed in claim 16 Wherein the controller comprises:

a current source for Supplying a reference current;

a source for supplying a high frequency sawtooth signal;

a current mode pulse width modulator coupled to receive said sensed current, said reference current and said high frequency sawtooth signal, said current mode pulse width modulator supplying said high frequency PWM switching signal component;

a source for said low frequency PWM switching signal component; and an AND-gate having a first input for receiving said high frequency PWM switching signal component, and a second input for receiving said low frequency PWM switching signal component, said AND-gate supplying said dual PWM switching signal.

18. The method as claimed in claim 16 wherein the controller comprises:

an adder for receiving a voltage reference signal and a high frequency sawtooth signal;

a comparator having an inverting input coupled to an output of said adder, and a non-inverting input coupled to receive said sensed current;

an RS flip-flop having a reset input coupled to an output of said comparator and a set input coupled to receive a high frequency clock signal; and an AND-gate having a first input coupled to an output of said RS flip-flop, and a second input coupled to receive the low frequency PWM switching signal component, said AND-gate supplying said dual PWM switching signal.

19. The method as claimed in claim 16 wherein the controller comprises;

an integrator coupled to receive said sensed current, said integrator forming an average of said sensed current;

a low frequency sawtooth generator having a variable user control input for varying a generated low frequency sawtooth signal;

a first reference current source;

a low frequency pulse width modulator coupled to receive said average sensed current, said low frequency sawtooth signal and said first reference current, said low frequency pulse width modulator varying a pulse width of the generated low frequency PWM switching signal component in dependence on the average sensed current and the low frequency sawtooth signal;

a sample-and-hold circuit also coupled to receive said sensed current, said sample-and-hold circuit having a control input for receiving the low frequency PWM switching signal component as a gate signal, said sample-and-hold circuit supplying a peak current signal of said sensed current;

a second reference current source;

a high frequency sawtooth generator for generating a high frequency sawtooth signal;

a high frequency pulse width modulator coupled to receive said peak current signal, said second reference current and said high frequency sawtooth signal, said high frequency pulse width modulator varying a pulse width of the generated high frequency PWM switching signal component in dependence on the peak current signal and the high frequency sawtooth signal; and an AND-gate having a first input signal for receiving the low frequency PWM switching signal component, and a second input for receiving the high frequency PWM switching signal component, said AND-gate supplying said dual PWM switching signal.

20. A supply assembly for a LED lighting module comprising:

a direct current (DC) voltage source having a first and a second supply terminal; a switched-mode converter connected to said first and second supply terminals for supplying power to an LED lighting module connectable to said converter, said converter comprising a controllable switch coupled to at least one of said first and second supply terminals for switchably connecting said DC voltage source to said LED lighting module when said controllable switch is in a conductive state; and a controller for controlling the switching of the controllable switch, said controller having means for supplying a dual pulse-width modulated switching signal to said controllable switch at two frequencies including a high frequency pulse-width modulated switching signal component for controlling a magnitude of an LED current in said LED lighting module, and a low frequency pulse-width modulated switching signal component for controlling a duration of the LED current; and wherein the controller further comprises an input for receiveing a sensed current indicative of the LED current, and means for modifying said low frequency pulse-width modulated switching signal component in dependence on said sensed current.

21. The supply assembly as claimed in claim 20, wherein the controller comprises:

a current source for supplying a reference current;

a source for supplying a high frequency sawtooth signal;

a current mode pulse width modulator coupled to receive said sensed current, said reference current and said high frequency sawtooth signal, said current mode pulse width modulator supplying said high frequency PWM switching signal component;

a source for said low frequency PWM switching signal component; and an AND-gate having a first input for receiving said high frequency PWM switching signal component, and a second input for receiving said low frequency PWM switching signal component, said AND-gate supplying said dual PWM switching signal.

22. The supply assembly as claimed in claim, wherein the controller comprises:

an adder for receiving a voltage reference signal and a high frequency sawtooth signal;

a comparator having an inverting input coupled to an output of said adder, and a non-inverting input coupled to receive said sensed current;

an RS flip-flop having a reset input coupled to an output of said comparator and a set input coupled to receive a high frequency clock signal; and an AND-gate having a first input coupled to an output of said RS flip-flop, and a second input coupled to receive the low frequency PWM switching signal component, said AND-gate supplying said dual PWM switching signal.

23. The supply assembly as claimed in claim 20, wherein the controller comprises:

an integrator coupled to receive said sensed current, said integrator forming an average of said sensed current;

a low frequency sawtooth generator having a variable user control input for varying a generated low frequency sawtooth signal;

a first reference current source;

a low frequency pulse width modulator coupled to receive said average sensed current, said low frequency sawtooth signal and said first reference current, said low frequency pulse width modulator varying a pulse width of the generated low frequency PWM switching signal component in dependence on the average sensed current and the low frequency sawtooth signal;

a sample-and-hold circuit also coupled to receive said sensed current, said sample-and-hold circuit having a control input for receiving the low frequency PWM switching signal component as a gate signal, said sample-and-hold circuit supplying a peak current signal of said sensed current;

a second reference current source;

a high frequency sawtooth generator for generating a high frequency sawtooth signal;

a high frequency pulse width modulator coupled to receive said peak current signal, said second reference current and said high frequency sawtooth signal, said high frequency pulse width modulator varying a pulse width of the generated high frequency PWM switching signal component in dependence on the peak current signal and the high frequency sawtooth signal; and an AND-gate having a firtst input for receiving the low frequency PWM switching signal component, and a second input for receiving the high frequency PWM switching signal component, said AND-gate supplying said dual PWM switching signal.

* * * * *